United States Patent

Reuschel et al.

[15] 3,698,354

[45] Oct. 17, 1972

[54] DEVICE FOR INDIFFUSING DOPANTS INTO A SEMICONDUCTOR MATERIAL

[72] Inventors: Konrad Reuschel, Vaterstetten; Karl Platzoder, Munich; Helga Kursawe, Pretzfeld, all of Germany

[73] Assignee: Siemens Aktiengesellschaft, Munich, Berlin and Erlangen, Germany

[22] Filed: Jan. 22, 1971

[21] Appl. No.: 108,724

[30] Foreign Application Priority Data

Feb. 27, 1970 Germany..........P 20 09 359.8

[52] U.S. Cl...............................................118/49.1

[51] Int. Cl...............................................C23c 13/08

[58] Field of Search..............................118/48–49.5; 148/174, 175; 117/106 R, 106 A, 106 C, 106 D, 107.2 R, 107.2 P, 107

[56] References Cited

UNITED STATES PATENTS

| | | | |
|---|---|---|---|
| 3,152,007 | 10/1964 | Perrin et al. | 118/48 X |
| 3,226,254 | 12/1965 | Reuschel | 118/49.5 X |
| 3,290,181 | 12/1966 | Sirtl | 148/175 UX |
| 3,293,074 | 12/1966 | Nickl | 118/49.5 X |
| 3,441,000 | 4/1969 | Burd et al. | 118/49.1 |
| 3,460,510 | 8/1969 | Currin | 118/48 |
| 3,486,933 | 12/1969 | Sussmann | 118/48 UX |
| 3,489,621 | 1/1970 | Sirtl | 117/106 A X |
| 3,492,969 | 2/1970 | Emeis | 118/49.1 |
| 3,526,205 | 9/1970 | Rosenheinrich | 118/49 |
| 3,578,495 | 5/1971 | Pammer et al. | 118/49.5 X |

*Primary Examiner*—Morris Kaplan

*Attorney*—Curt M. Avery, Arthur E. Wilfond, Herbert L. Lerner and Daniel J. Tick

[57] ABSTRACT

The present invention relates to a device for indiffusing dopants into a semiconductor material, in high vacuum. The device comprises a heatable ampule which is accommodated in a sealed container and consists of the same semiconductor material and contains wafers of the semiconductor material to be doped. The ampule, at least on its outer surface, has at least a partially polycrystalline surface. The ampule has openings whose area is small in comparison to the cross-section surface of the ampule and that a dopant source is available which is located outside the ampule but within the sealed container.

14 Claims, 1 Drawing Figure

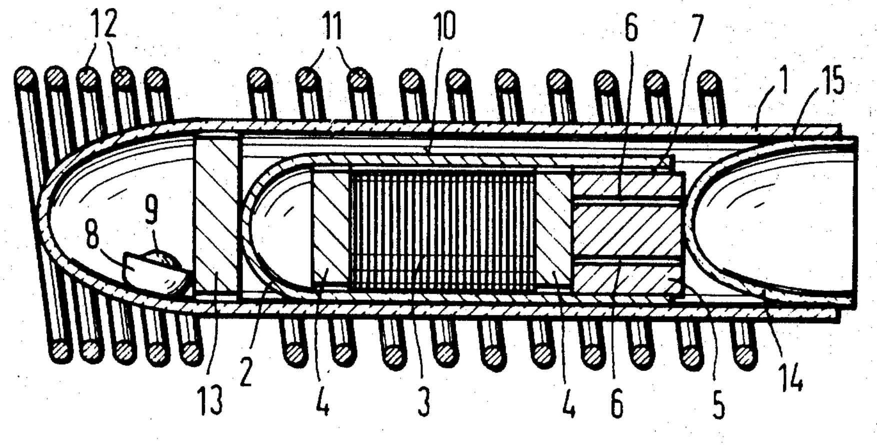
12
11
10
6
7
1
15
8
9
13
2
4
3
4
6
5
14

DEVICE FOR INDIFFUSING DOPANTS INTO A SEMICONDUCTOR MATERIAL

The present invention relates to a device for indiffusing dopants into a semiconductor material in high vacuum. The device comprises a heatable ampule which is accommodated in a sealed container and consists of the same semiconductor material and contains wafers of the semiconductor material to be doped.

Such a device had previously been suggested. It can be used to diffuse semiconductor wafers which, provided their crystal texture prior to diffusion, were free of disturbances, will, to a high degree, continue to remain free of disturbances of the crystal texture. This is due to the fact that the semiconductor wafers are not being chemically attacked by the ampule material, which is the same as the material of the semiconductor wafers. Furthermore, an ampule of semiconductor material for example silicon, is a very good heat conductor at higher temperatures. As a result, the interior of an ampule heated to higher temperatures and comprising semiconductor material, has virtually the same over all temperature. This helps to avoid internal tensions which may produce lattice defects and which occur particularly during the cooling of the device. These lattice defects, at great density, may act as recombination centers in a semiconductor body.

The recombination centers may, however, form primarily to other causes, for example, heavy metal atoms being installed in the crystal lattice of the semiconductor bodies. These heavy metal atoms, for example gold or copper, are always present, for example in trace quantity within the dopants, being used at the particular time. The heavy metals may also be present in the container material comprising, for example, quartz glass and may diffuse therefrom into the semiconductor wafers. Such heavy metal atoms diffuse together with the desired dopants into the semiconductor body and are being installed there into the crystal lattice. There they act, primarily in connection with the above-indicated crystal defects, as recombination centers for the free charge carriers, loaded in the semiconductor body.

The object of the present invention is to provide a device for the afore-mentioned type whereby the share of the heavy metal atoms diffused into the semiconductor wafers may be reduced so that dislocation-free semiconductor wafers will be produced or wafers having dislocations will receive no additional dislocations during the respective diffusion and cooling processes.

The invention is characterized in that the ampule, at least on its outer surface, has at least a partially polycrystalline surface. The ampule has openings whose total area is small in comparison to the cross-section area of the ampule and that a dopant source is available which is located outside the ampule, but within the sealed container.

Preferably these openings have an area between 0.1 percent and 20 percent of the cross-section area of the ampule. It is particularly recommended to seal the ampule on one side with a stopper and to form the openings through porosities between the stopper and the ampule. The dopant source is placed, preferably, on the side of the ampule facing away from the stopper.

The invention will be disclosed in an embodiment example, with reference to the drawing, In the device shown in the FIGURE there is a closed container 1, wherein a high vacuum of approximately $10^{-6}$ Torr prevails. The container 1 consists, for example, of a quartz ampule, which is melted off at 15° in the shape of a ring by quartz stopper 14. The container 1 contains an ampule 2, wherein wafers 3 of the semiconductor material are arranged. The wafers 3 of semiconductor material are so held together by supports 4 in the ampule 2 to prevent a canting of the wafers 3. The ampule 2 and the semiconductor wafers and preferably also the support discs 4, are made of the same material. The support discs are so dimensioned that there is enough room between their periphery and the inner wall of the ampule to provide passage of the dopants, to the semiconductor wafer. To this end, the support discs 4 may also be provided with slots or openings.

The ampule 2 is sealed with a stopper 5, wherein openings 6 are provided. The total area of these openings is small relative to the cross-section area of the ampule. It is recommended, however, that the total area of the openings not be smaller than 0.1 percent of the cross-section area of the ampule so that the access for the dopants is not impaired. However, the total area of the openings should not amount to more than 20 percent of the cross-section, as otherwise the temperature gradient becomes too great in the interior of the ampule and internal tensions will occur in the semiconductor wafers, due to the temperature gradient. The openings in the ampule 2 need not necessarily be located in the stopper 5, it may be enough to have the stopper 5 fit loosely into the end of the ampule 2, so that no gas-tight sealing will occur between the stopper 5 and the ampule 2. The thus formed connection between the inner space of the ampule 2 and the inner space of the container 1 is indicated by 7, in the FIGURE.

The ampule 2 is positioned in the interior of the container between a supporting disc 13 and the quartz stopper 14. The quartz stopper 14 is preferably so inserted that it exerts a pressure upon the stopper 5 ranging between 0.1 and 100 gr/cm$^2$. This will prevent the semiconductor discs from bending under the action of the high temperature used during diffusion and thus internal tensions will not occur in the crystal texture. The ampule 2 braces against the supporting disc 13. The latter has openings or is so fitted into the container 1, that the penetration of dopants is insured. Preferably, this support disc comprises the same semiconductor material.

Inside the container 1, but outside the ampule 2, is a vessel 8, which contains the dopant 9. The container is surrounded by heating coils, the first denoted 11 and the second 12. With the aid of these heating coils, the temperature of the ampule and the temperature of the dopant source may be separately adjusted, since the dopant source must frequently have temperature other that the semiconductor material, to be doped.

During the doping of the semiconductor wafers 3 within the ampule 2, the doping substances such as for example, aluminum, gallium, are heated to a temperature at which the desired vapor pressure occurs. The doping substance expands in the interior of the container 1 and penetrates through the openings 6 and/or 7, into the interior of the ampule 2. There, the doping substance diffused into the wafers 3. On the way to the openings 6 or 7, the molecules of the gaseous dopant materials, whose free path length in the high vacuum is very long, establish multiple contact with the outer wall 10 of the ampule 2. The outer wall comprises, at least partly, polycrystalline material, i.e. a material where foreign substances like to concentrate which occur as a result of crystal faults resulting from the outside. A considerable portion of the heavy metal traces contained in the interior of the container 1, deposit on the outer surface 10 of the ampule 2, next to a portion of the dopant. In this way, the heavy metal traces no longer reach the surface of the wafers 3. This action can be further supported by the polycrystalline surface of the support disc 13.

A portion of the doping substance becomes installed into the surface of the ampule together with the aforementioned volume of heavy metal atoms and diffuses a distance into the ampule wall. Since the doping substance is available in large excess, the volume which enters the interior of the ampule through openings 6 or 7, suffices for doping the semiconductor wafers 3, as desired. Similarly, not all heavy metal atoms are caught by the polycrystalline surface of the ampule, rather a certain part reaches the inside of the ampule and diffuses there, into the semiconductor wafers.

The invention makes it possible to reduce the number of recombination centers in a semiconductor body. A semiconductor device or component which has a semiconductor body that diffuses in a device according to the invention, will thus possess a higher carrier life time and thus a lower voltage drop in forward direction, than a comparison material which had not been diffused in a device of the present invention. This makes it possible to obtain a very low concentration of heavy metals in the semiconductor, even following diffusion. An additional controlled supplement of heavy metals permits to obtain a desired carrier life span, within wide limits, primarily in dislocation-free crystals. This affords the opportunity, for example in thyristors, to observe a preselected recovery time with narrow manufacturing tolerances.

The invention may also be used in the same sense in semiconductor materials such as germanium, silicon carbide and III-V compounds, such as gallium arsenide.

We claim:

1. A device for indiffusing dopants into a semiconductor material in high vacuum, which comprises a heatable ampule in a sealed container, said ampule comprises a material selected from the group consisting of silicon, germanium, silicon carbide, a III-V compound and gallium arsenide, at least the outer surface of the ampule is at least polycrystalline, the ampule has openings therein which in total area are small in comparison to the cross-sectional area of the ampule and a dopant source which is located outside the ampule and within the sealed container.

2. The device of claim 1, wherein the surface openings have an area of 0.1 percent to 20 percent of the cross-sectional area of the ampule.

3. The device of claim 2, wherein the ampule is closed with a stopper and the openings are in the stopper.

4. The device of claim 2, wherein the ampule is closed with a stopper and the openings are between the stopper and the ampule.

5. The device of claim 2, wherein the ampule is closed with a stopper, said stopper being forced with a pressure of 0.1 to 100 gm/cm$^2$ against the wafers when inserted.

6. The device of claim 5, wherein supporting discs of semiconductor material is provided for supporting the wafers to be inserted.

7. The device of claim 6, wherein a support disc is between the ampule and a dopant source within the container.

8. The device of claim 6, wherein a sealed in quartz stopper is so inserted into the container that the support disc between the ampule and the dopant source serves as a stopper.

9. The device of claim 5, wherein the dopant source and the stopper lie on opposite sides of the ampule.

10. The device of claim 9, wherein the ampule is of silicon, when silicon wafers are to be inserted therein.

11. The device of claim 9, wherein the ampule is of germanium, when germanium wafers are to be inserted therein.

12. The device of claim 9, wherein the ampule is of silicon carbide, when silicon carbide wafers are to inserted therein.

13. The device of claim 9, wherein the ampule is of a III-V compound, when III-V compounds are to be inserted therein.

14. The device of claim 9, wherein the ampule is of gallium arsenide, when gallium arsenide wafers are to inserted therein.

* * * * *